US012696826B2

(12) United States Patent

Arkalgud

(10) Patent No.: US 12,696,826 B2

(45) Date of Patent: Jul. 28, 2026

(54) SYSTEMS AND METHODS FOR BONDING SEMICONDUCTOR DEVICES

(71) Applicant: Tokyo Electron Limited, Tokyo (JP)

(72) Inventor: Sitaram Arkalgud, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 620 days.

(21) Appl. No.: 18/072,096

(22) Filed: Nov. 30, 2022

(65) Prior Publication Data

US 2024/0178180 A1 May 30, 2024

(51) Int. Cl.

| *H10W 72/00* | (2026.01) |
| *H10W 72/30* | (2026.01) |
| *H10W 72/90* | (2026.01) |
| *H10W 99/00* | (2026.01) |
| *H10W 74/00* | (2026.01) |
| *H10W 80/00* | (2026.01) |
| *H10W 90/00* | (2026.01) |

(52) U.S. Cl.
CPC .......... *H10W 99/00* (2026.01); *H10W 72/019* (2026.01); *H10W 72/30* (2026.01); *H10W 72/90* (2026.01); *H10W 72/922* (2026.01); *H10W 72/9226* (2026.01); *H10W 72/923* (2026.01); *H10W 74/00* (2026.01); *H10W 80/035* (2026.01); *H10W 80/102* (2026.01); *H10W 80/211* (2026.01); *H10W 80/312* (2026.01); *H10W 80/327* (2026.01); *H10W 90/736* (2026.01); *H10W 90/792* (2026.01)

(58) Field of Classification Search
None
See application file for complete search history.

(56) References Cited

U.S. PATENT DOCUMENTS

| 6,875,692 B1 * | 4/2005 | Chang ............... H01L 21/76877 |
| | | 257/E21.585 |
| 2006/0270075 A1 | 11/2006 | Leem |
| 2012/0299126 A1 | 11/2012 | Daamen et al. |

(Continued)

FOREIGN PATENT DOCUMENTS

WO    WO-2021084902 A1 *   5/2021    ............. H10P 95/04

OTHER PUBLICATIONS

Translation of WO-2021084902-A1 (Year: 2021).*
International Search Report and Written Opinion on PCT App. PCT/US2023/031484 dated Dec. 8, 2023 (10 pages).

*Primary Examiner* — Kretelia Graham
*Assistant Examiner* — William Henry Anderson
(74) *Attorney, Agent, or Firm* — Foley & Lardner LLP

(57) ABSTRACT

A method for manufacturing semiconductor packages. The method includes providing a first semiconductor die including a plurality of metallization layers; completely overlaying a topmost one of the metallization layers with a barrier layer; completely overlaying the barrier layer sequentially with a stop layer and a laser liftoff layer; attaching a first side of the first semiconductor die to a first wafer through at least the laser liftoff layer; attaching a second side of the first semiconductor die to a second wafer; removing the first wafer from the first semiconductor die based on the laser liftoff layer; forming a plurality of connectors on the first side of the first semiconductor die to electrically couple to the topmost metallization layer; and bonding the first semiconductor die to a third wafer that includes a second semiconductor die.

20 Claims, 11 Drawing Sheets

(56)  References Cited

U.S. PATENT DOCUMENTS

| 2019/0172707 | A1* | 6/2019 | Umehara .......... H01L 21/02219 |
| 2021/0082874 | A1* | 3/2021 | Chen ..................... H01L 21/56 |
| 2021/0183803 | A1* | 6/2021 | Bayless ................. H01L 25/50 |
| 2021/0398973 | A1* | 12/2021 | Chen ..................... H10D 88/00 |
| 2022/0208727 | A1 | 6/2022 | Yang et al. |

* cited by examiner

SYSTEMS AND METHODS FOR BONDING SEMICONDUCTOR DEVICES

TECHNICAL FIELD

This disclosure relates to semiconductor devices and methods of bonding a plural number of semiconductor devices.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed, and greater bandwidth, as well as lower power consumption and latency has grown recently, there has grown a need for smaller and more creative packaging techniques of semiconductor dies.

SUMMARY

At least one aspect of the present disclosure is directed to a method for manufacturing semiconductor packages. The method includes providing a first semiconductor die including a plurality of metallization layers; completely overlaying a topmost one of the metallization layers with a barrier layer; completely overlaying the barrier layer sequentially with a stop layer and a laser liftoff layer; attaching a first side of the first semiconductor die to a first wafer through at least the laser liftoff layer; attaching a second side of the first semiconductor die to a second wafer; removing the first wafer from the first semiconductor die through the laser liftoff layer; forming a plurality of connectors on the first side of the first semiconductor die to electrically couple to the topmost metallization layer; and bonding the first semiconductor die to a third wafer that includes a second semiconductor die.

In some embodiments, the second semiconductor die includes a plurality of second metallization layers and a plurality of second connectors. The step of bonding the first semiconductor die to a third wafer comprises connecting at least one of the plurality of connectors to a corresponding one of the plurality of second connectors.

In some embodiments, prior to forming the plurality of connectors, the method further includes forming a plurality of vias extending through the barrier layer to be in contact with the topmost metallization layer. Each of the plurality of vias is in contact with a corresponding one of the plurality of connectors.

In some embodiments, the step of removing the first wafer includes applying a laser from the first side of the of the first semiconductor die to cause thermochemical dissociation of the laser liftoff layer. The method further includes polishing out any remaining portion of the laser liftoff layer until the stop layer is exposed.

In some embodiments, the step of attaching a second side of the first semiconductor die to a second wafer includes forming a first bonding layer over the second side of the first semiconductor die; planarizing the first bonding layer using a laser; forming a second bonding layer over the second wafer; and bonding the first bonding layer to the second bonding layer. The step of forming a first bonding layer, the step of planarizing the first bonding layer, and the step of bonding the first bonding layer to the second bonding layer are each performed in an elevated temperature.

In some embodiments, the step of forming a plurality of connectors on the first side of the first semiconductor die is performed at a temperature not greater than about 250° C.

At least another aspect of the present disclosure is directed to a method for manufacturing semiconductor packages. The method includes bonding a plurality of semiconductor dies to a first wafer on their respective first sides; bonding the plurality of semiconductor dies to a second wafer on their respective second sides; decoupling the first wafer from the plurality of semiconductor dies; forming a plurality of first connecters in electrical contact with the plurality of semiconductor dies that are placed on the second wafer; and bonding the plurality of semiconductor dies to a third wafer by connecting the plurality of first connecters to a plurality of second connectors disposed on the third wafer, respectively.

In some embodiments, the step of forming a plurality of first connecters is performed after any of the step of bonding a plurality of semiconductor dies to a first wafer, the step of bonding the plurality of semiconductor dies to a second wafer, or the step of decoupling the first wafer from the plurality of semiconductor dies. Each of the step of bonding a plurality of semiconductor dies to a first wafer, the step of bonding the plurality of semiconductor dies to a second wafer, and the step of decoupling the first wafer from the plurality of semiconductor dies is performed in an elevated temperature.

In some embodiments, the step of decoupling the first wafer from the plurality of semiconductor dies includes applying a laser through the first wafer on the first sides of the semiconductor dies.

In some embodiments, prior to forming the plurality of first connecters, each of the semiconductor dies includes a plurality of metallization layers; a barrier layer completely overlaying a topmost one of the plurality of metallization layers; a dielectric layer overlaying the barrier layer; a stop layer overlaying the dielectric layer; and a laser liftoff layer overlaying the stop layer. Subsequently to decoupling the first wafer from the plurality of semiconductor dies, the method further includes polishing from the first sides of the semiconductor dies until the stop layer of at least one of the semiconductor dies is exposed; and forming a plurality of vias extending through the barrier layer and the dielectric layer. The plurality of first connectors are electrically coupled to the topmost metallization layer through the plurality of vias, respectively.

In some embodiments, the step of bonding the plurality of semiconductor dies to a third wafer is performed through a hybrid bonding technique.

Yet another aspect of the present disclosure is directed to a method for manufacturing semiconductor packages. The method includes preparing a plurality of semiconductor dies, each of the plurality of semiconductor dies, on its first side, including a plurality of metallization layers, a dielectric layer completely overlaying a topmost one of the metallization layers, a stop layer overlaying the dielectric layer, and a laser liftoff layer overlaying the stop layer; bonding the plurality of semiconductor dies to a first wafer with the respective first sides; bonding the plurality of semiconductor dies to a second wafer with their respective second sides; decoupling, based on causing thermochemical dissociation of the laser liftoff layer of each of the plurality of semiconductor dies, the first wafer from the plurality of semiconductor dies; forming a plurality of vias extending through the dielectric layers to be in contact with the topmost metallization layers, respectively; forming a plurality of first connecters in contact with the plurality of vias, respectively; and bonding the plurality of semiconductor dies to a third wafer by connecting the plurality of first connecters to a plurality of second connecters disposed on the third wafer, respectively.

In some embodiments, each of the step of bonding a plurality of semiconductor dies to a first wafer, the step of bonding the plurality of semiconductor dies to a second wafer, and the step of decoupling the first wafer from the plurality of semiconductor dies is performed in an elevated temperature.

In some embodiments, each of the step of forming a plurality of vias and the step of forming a plurality of first connecters is performed at a temperature not greater than about 250° C.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustrations and a further understanding of the various aspects and implementations, and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
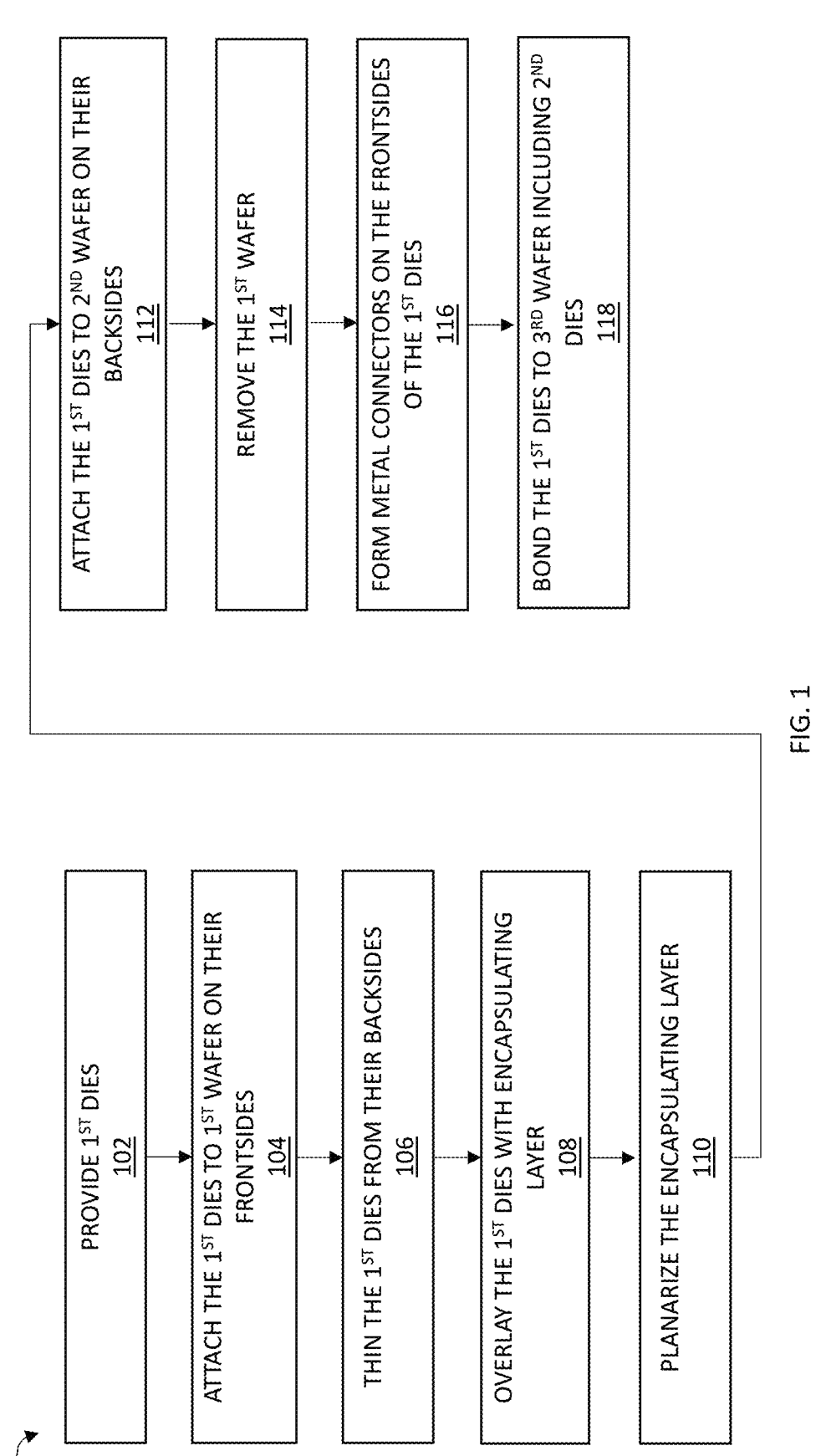
FIG. 1 illustrates a flow chart of an example method for making a semiconductor package, in accordance with some embodiments.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

As semiconductor technologies further advance, stacked semiconductor devices, e.g., 3D integrated circuits (3DICs), have emerged as an effective alternative to further reduce the physical size of a semiconductor device. In a stacked semiconductor device, active circuits such as logic, memory, processor circuits and the like are fabricated on different semiconductor wafers. Two or more semiconductor wafers may be installed on top of one another to further reduce the form factor of the semiconductor device.

Two semiconductor wafers or dies may be bonded together through suitable bonding techniques. The commonly used bonding techniques include direct bonding, chemically activated bonding, plasma activated bonding, anodic bonding, eutectic bonding, glass frit bonding, adhesive bonding, thermo-compressive bonding, reactive bonding, hybrid bonding, and/or the like. An electrical connection may be provided between the stacked semiconductor wafers/dies (or stacked semiconductor devices). The stacked semiconductor devices may provide a higher density with smaller form factors and allow for increased performance and lower power consumption.

Of particular interest is hybrid bonding, which requires no specific high-temperature annealing process. In the hybrid bonding technique, a permanent bond combines a dielectric bond (e.g., $SiO_x$) with one or more embedded metal (e.g., Cu) bonds to form interconnections. Hybrid bonding extends fusion bonding with embedded metal pads in the bond interface, which allows face-to-face connection of different semiconductor wafers/dies. However, in the existing technologies, the embedded metal pads of a semiconductor device are typically formed right after a topmost metallization layer of the semiconductor device is formed, i.e., prior to the semiconductor device being processed for bonding to another semiconductor device. One or more of such process steps (e.g., fusion bonding to a carrier/sacrificial substrate, laser planarization, laser liftoff, etc.) typically require a high-temperature annealing process, which can likely damage the metal pads. As such, the existing technologies to bond different semiconductor devices have not been entirely satisfactory in some aspects.

The present disclosure provides various embodiments of a method for bonding semiconductor devices (e.g., dies-to-wafer, wafer-to-wafer, die-to-die) that may advantageously circumvent the above-identified issues. In one aspect of the present disclosure, instead of forming metal pads right after the topmost metallization layer of a to-be bonded semiconductor device, the method, as disclosed herein, may include not forming metal pads (and corresponding via structures connecting them to the topmost metallization layer) until the semiconductor device has progressed through the steps that require a high-temperature annealing process. For example, the semiconductor device may be first bonded to a first carrier/sacrificial wafer through a number of layers completely overlaying the topmost metallization layer, bonded to a second carrier/sacrificial wafer through a bonding layer, and then released from the first carrier/sacrificial wafer. Each of these steps may include a high-temperature annealing process. By arranging the step of forming metal pads after those high-temperature annealing process, the metal pads can advantageously be free from damage induced by the high-temperature annealing process. As such, the disclosed method can solve the technical issues that the existing technologies are facing.

FIG. 1 illustrates a flowchart of an example method 100 for forming a semiconductor package with at least one reconstituted wafer having a number of semiconductor dies boned to another wafer through low-temperature hybrid bonding. It is noted that the method 100 is merely an example, and is not intended to limit the present disclosure. Accordingly, it is understood that additional operations may be provided before, during, and after the method 100 of FIG. 1, and that some other operations may only be briefly described herein.

In various embodiments, operations of the method 100 may be associated with cross-sectional views of an example semiconductor package 200 at various fabrication stages as shown in FIGS. 2 to 11, respectively, which will be discussed in further detail below. It should be understood that the semiconductor package 200, shown in FIGS. 2 to 11, may include a number of other devices such as inductors, fuses, capacitors, coils, etc., while remaining within the scope of the present disclosure.

In brief overview, the method 100 starts with operation 102 of providing a number of first semiconductor dies, each of which includes a number of metallization layers formed on its first side. In various embodiments, a topmost one of the metallization layer of each of the first semiconductor dies may be completely overlaid with at least a barrier layer, a stop layer, and a laser liftoff (LLO) layer. The method 100 proceeds to operation 104 of attaching the first semiconductor dies to a first (sacrificial) wafer on their first sides. The method 100 proceeds to operation 106 of thinning the first semiconductor dies from their respective second sides (e.g., backside). The method 100 proceeds to operation 108 of overlaying the first semiconductor dies with an encapsulating layer. The method 100 proceeds to operation 110 of planarizing the encapsulating layer. The method 100 proceeds to operation 112 of attaching the first semiconductor dies to a second (support) wafer on their second sides. The method 100 proceeds to operation 114 of removing the first wafer based on the LLO layer. The method 100 proceeds to operation 116 of forming metal connectors on the first side of each of the first semiconductor dies. The method 100 proceeds to operation 118 of bonding the first semiconductor dies to a third (semiconductor) wafer that includes a number of second semiconductor dies. In various embodiments of the present disclosure, any operation after operation 116 (e.g., operation 118) may be performed without an annealing process or in a substantially low temperature, for example, not greater than about 250° C.

Figure 2:
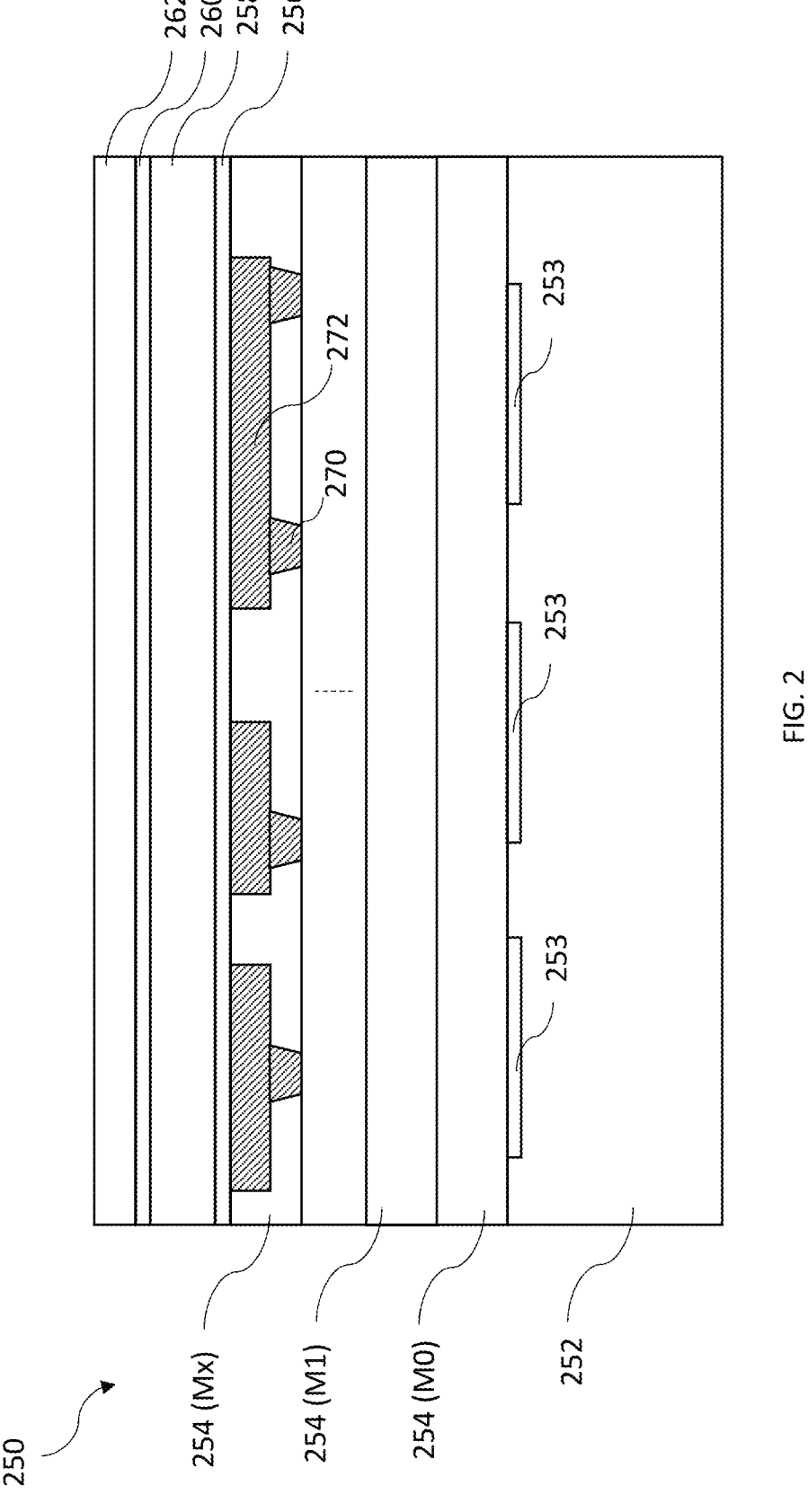
FIGS. 2 to 11 illustrate respective cross-sectional views of a semiconductor package during various fabrication stages, made by the method of FIG. 1, in accordance with some embodiments.

Corresponding to operation 102 of FIG. 1, FIG. 2 is a cross-sectional view of an example first semiconductor die 250 to be included in the semiconductor package 200, at one of the various stages of fabrication, in accordance with various embodiments.

As shown, the first semiconductor die 250 includes a substrate 252, a number of metallization layers 254 over the substrate 252, a barrier layer 256 over a topmost one of the metallization layers, an interlayer dielectric (ILD) or inter-metal dielectric (IMD) material 258 over the barrier layer 256, a stop layer 260 over the ILD material 258, and a laser liftoff (LLO) layer 262 over the stop layer 260. Each of the metallization layers 254, disposed on a first side of the substrate 252, includes a number of interconnect structures such as, for example, metal lines 270 and vias 272. A bottommost of the metallization layers 254 is sometimes referred to as M0, with the following metallization layers referred to as M1, M2, etc., respectively, and the topmost metallization layer is sometimes referred to as Mx. In various embodiments of the present disclosure, the barrier layer 256 (and the following layers 258 to 262) may completely overlay the topmost metallization layer Mx.

The substrate 252 may be a semiconductor substrate, such as a bulk semiconductor, a semiconductor-on-insulator (SOI) substrate, or the like, which may be doped (e.g., with a p-type or an n-type dopant) or undoped. The substrate 252 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 252 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 252 includes a number of device features/structures 253 (e.g., transistors, diodes, resistors, etc., which are not shown for the sake of clarity) formed along a surface of the substrate 252. Over the surface of the substrate 252, a plural number of the metallization layers 254, each including a number of interconnect structures (e.g., metal lines 270 and vias 272), can be formed. These interconnect structures across the metallization layers 254 are configured to electrically connect the device structures to one another so as to form an integrated circuit, which can function as a logic device, a memory device, an input/output device, or the like. The interconnect structures (e.g., formed of conductive materials, such as Cu, Al, W, Ti, TiN, Ta, TaN, or multiple layers or combinations thereof) may be embedded in one or more ILD or IMD materials (e.g., low-k dielectric materials, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like).

Further, on the topmost metallization layer, Mx, the barrier layer 256 is formed, followed by the formation of ILD/IMD material 258, stop layer 260, and LLO layer 262. The barrier layer 256 may comprises cobalt, ruthenium, tantalum, tantalum nitride, indium oxide, tungsten nitride, titanium nitride, and/or combinations thereof, as examples, although alternatively, the barrier layer 256 may comprise other materials. The ILD/IMD material 258 may include one or more low-k dielectric materials, such as silicon oxide ($SiO_2$). The stop layer 260, which is configured to stop at least one of an etching process or a polishing process, may include a dielectric material such as, for example, silicon nitride (SiN). The LLO layer 262 can be utilized as a bonding layer to attach the first semiconductor die 250 to a carrier wafer (which will be illustrated in FIG. 3). Further, the LLO layer 262 can be induced with thermochemical dissociation, upon being applied with a laser, thereby allowing the first semiconductor die 250 to be later removed from the carrier wafer (which will be illustrated in FIG. 8). In some embodiments, the LLO layer 262 may include a silicon-based dielectric material such as, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

Figure 3:
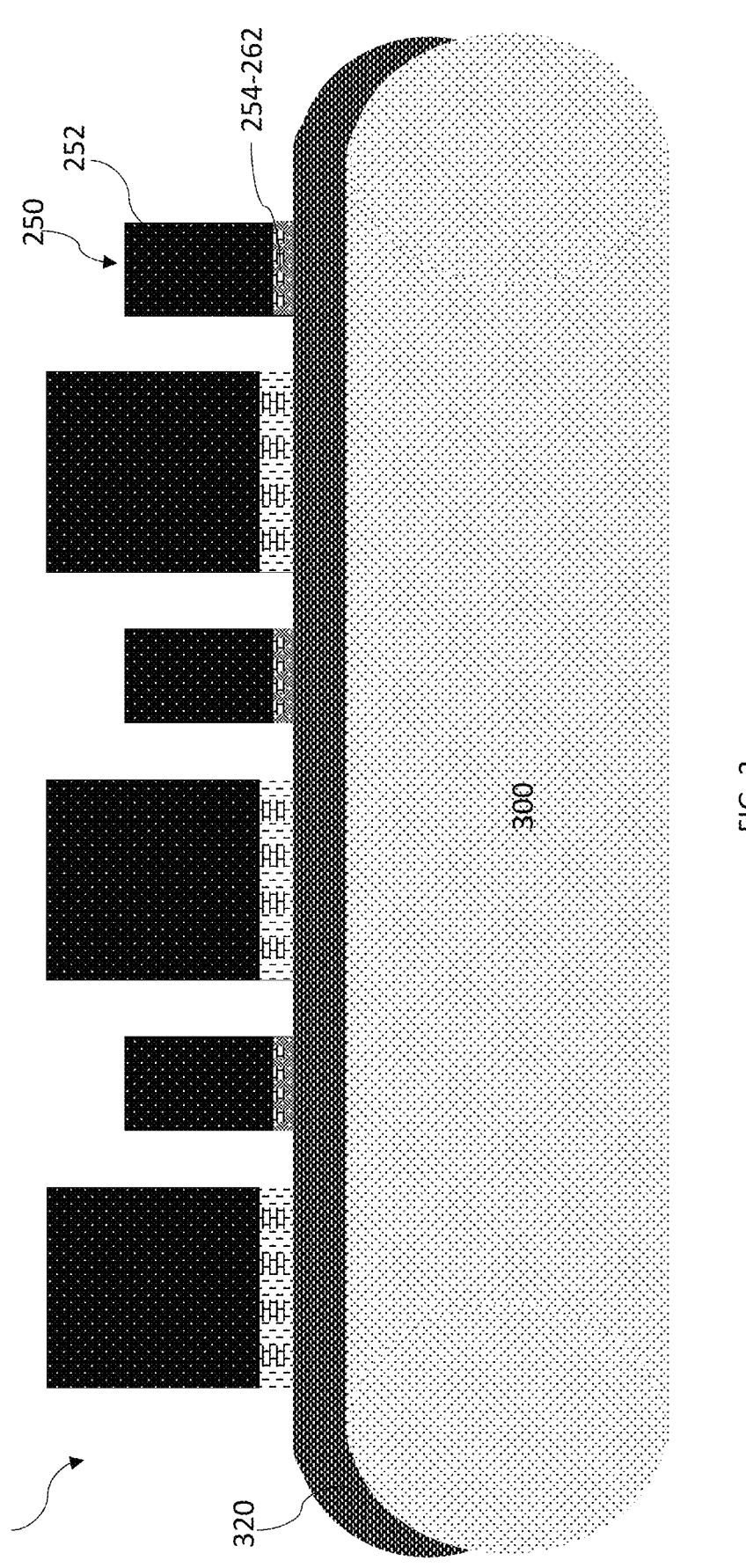

Corresponding to operation 104 of FIG. 1, FIG. 3 is a cross-sectional view of the semiconductor package 200 in which a number of the first semiconductor die 250 are bonded to a sacrificial wafer 300, at one of the various stages of fabrication, in accordance with various embodiments.

In some embodiments, the first semiconductor die 250 can be bonded to the sacrificial wafer 300 to form a reconstituted wafer. It should be noted that the reconstituted wafer at the current stage may not be completely finished, i.e., one or more components will be removed or added. For example in FIG. 3, each of the first semiconductor die 250 is flipped and attached to the sacrificial wafer 300, with their respective metallization layers 254 and the overlaying layers 256 to 262 interposed therebetween. Further, the first semiconductor die 250 may be bonded to the sacrificial wafer 300 through a fusion bonding process. The fusion bonding process may involve bringing the first semiconductor die 250 and the sacrificial wafer 300 into intimate contact, which causes them to hold together due to atomic attraction forces (i.e., Van der Waal forces). The first semiconductor die 250 and the sacrificial wafer 300 may be subjected to an annealing process, after which a solid bond may be formed between the first semiconductor die 250 and the sacrificial wafer 300. A temperature for the annealing process may be any suitable temperature, such as between about 250° C. and about 350° C. The fusion bonding process may arise from $SiO_2$ (oxide)/Si bonding, Si/Si bonding, and/or other suitable bonding. In some embodiments, an optional bonding layer 320 (e.g., formed of silicon oxide) may be formed over the sacrificial wafer 300.

Figure 4:
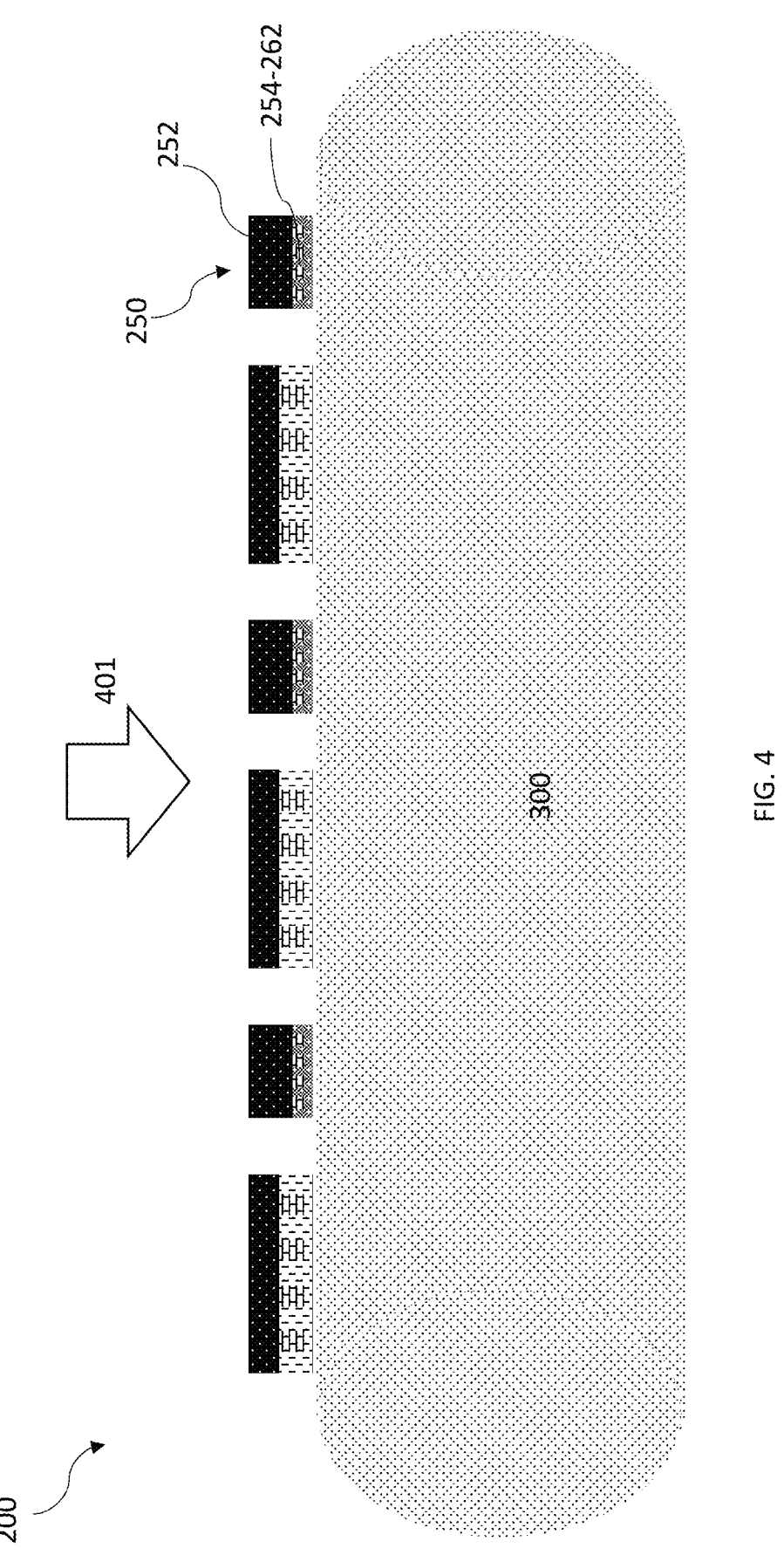

Corresponding to operation 106 of FIG. 1, FIG. 4 is a cross-sectional view of the semiconductor package 200 in which a polishing process 401 is performed from backsides of the first semiconductor die 250, at one of the various stages of fabrication, in accordance with various embodiments.

With each of the first semiconductor die 250 having a respective thickness (or height) as shown in FIG. 3, the polishing process 401 may polish the first semiconductor dies 250 from their backsides. As such, a level (virtual) surface may be formed by respective polished bottom surfaces of the first semiconductor die 250, as shown in FIG. 4. The polishing process 401 may include a chemical mechanical polishing (CMP) process, in some embodiments.

Figure 5:
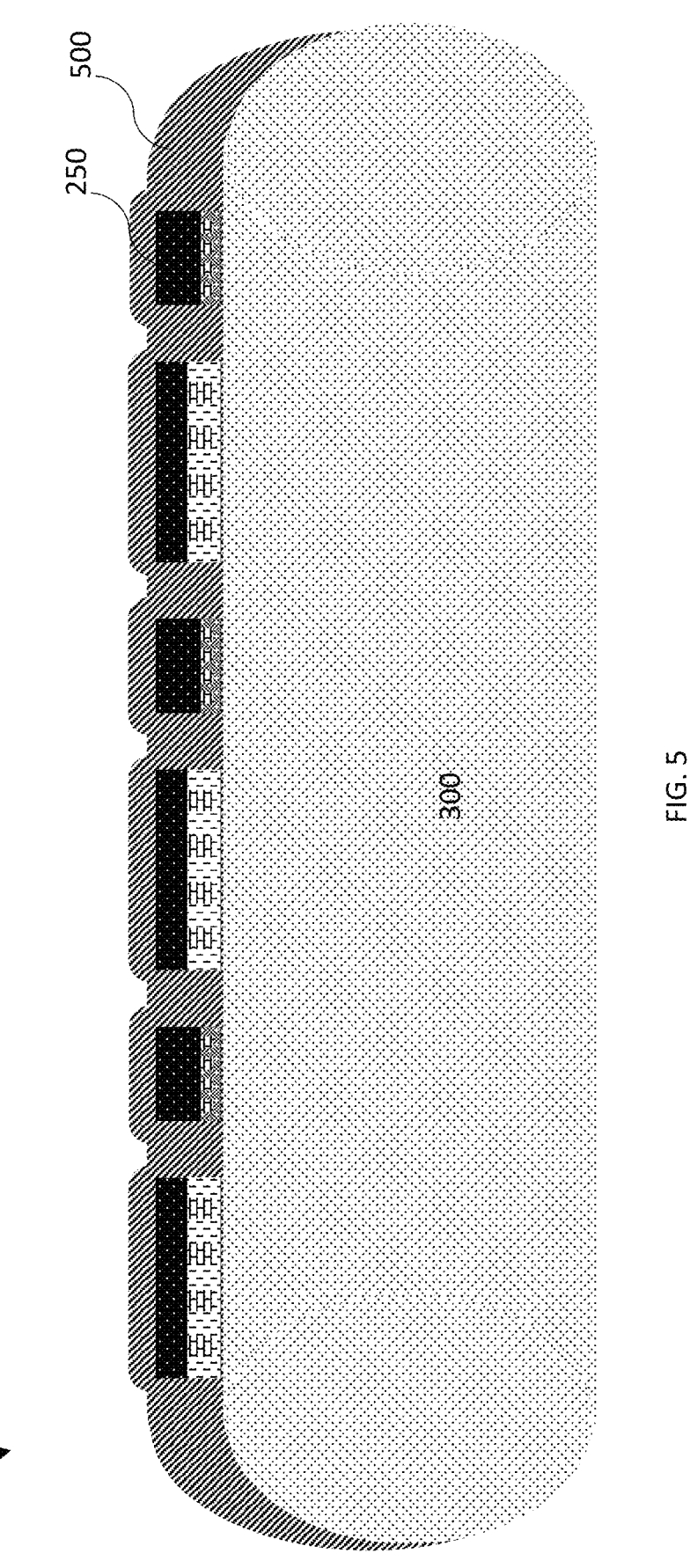

Corresponding to operation 108 of FIG. 1, FIG. 5 is a cross-sectional view of an the semiconductor package 200 in which an encapsulating layer 500 may be formed over the first semiconductor dies 250, at one of the various stages of fabrication, in accordance with various embodiments.

The encapsulating layer 500, formed over the reconstituted wafer 300, may be continuously around each of the semiconductor dies 250. In some embodiments, the encapsulating layer 500, which may be deposited or thermally grown at an elevated temperature (e.g., higher than 250° C.), may include epoxy, polyimide, benzocyclobutene (BCB), polybenzoxazole (PBO) or a combination thereof, with or without filler embedded therein. The filler may include carbon filler or glass filler. In some embodiments, the encapsulating layer 500 may include a silicon-based dielectric material such as, for example, silicon oxide, silicon nitride, silicon oxynitride, silicon carbide, silicon carbonitride, silicon oxycarbonitride, silicon oxycarbide, multilayers thereof, or the like.

Figure 6:
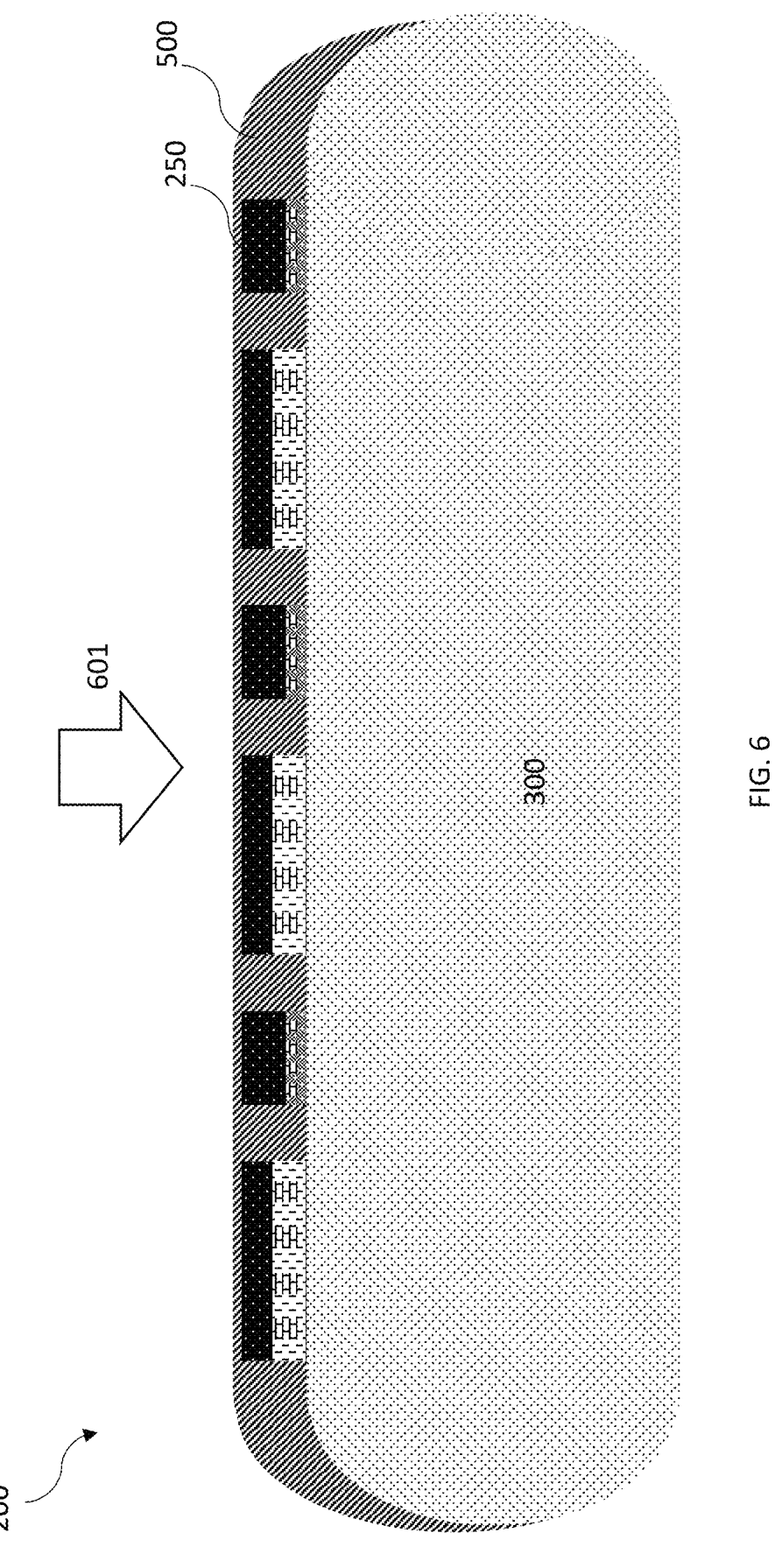

Corresponding to operation 110 of FIG. 1, FIG. 6 is a cross-sectional view of the semiconductor package 200 in which a polishing process 601 may be performed on the encapsulating layer 500, at one of the various stages of fabrication, in accordance with various embodiments.

As shown in FIG. 5, upon being formed, the encapsulating layer 500 may present a non-even surface. In order to bond the reconstituted wafer to another wafer (e.g., a support wafer which will be shown below), the non-even surface of the encapsulating layer 500 may be polished using the polishing process 601. Accordingly, the surface of the encapsulating layer 500 opposite to its other surface contacting the sacrificial wafer 300 may be leveled. In some embodiments, the polishing process 601 may include a laser polishing process. Such a laser polishing process can include applying a laser beam with very high power densities in pulse form, which is typically performed at an elevated temperature (e.g., higher than 250° C.).

Figure 7:

Corresponding to operation 112 of FIG. 1, FIG. 7 is a cross-sectional view of the semiconductor package 200 in which the reconstituted wafer (including the first semiconductor dies 250 bonded to the sacrificial wafer 300) is attached to a support wafer 700, at one of the various stages of fabrication, in accordance with various embodiments.

The reconstituted wafer may be bonded to the support wafer 700 through a fusion bonding process. The fusion bonding process may involve bringing the reconstituted wafer and the support wafer 700 into intimate contact, which causes them to hold together due to atomic attraction forces (i.e., Van der Waal forces). The reconstituted wafer and the support wafer 700 may be subjected to an annealing process, after which a solid bond may be formed between the reconstituted wafer and the support wafer 700 (e.g., between the encapsulating layer 500 and the support wafer 700). A temperature for the annealing process may be any suitable temperature, such as between about 250° C. and about 350° C. The fusion bonding process may arise from $SiO_2$ (oxide)/Si bonding, Si/Si bonding, and/or other suitable bonding. In some embodiments, an optional bonding layer 720 (e.g., formed of silicon oxide) may be formed between the encapsulating layer 500 and the support wafer 700.

Figure 8:
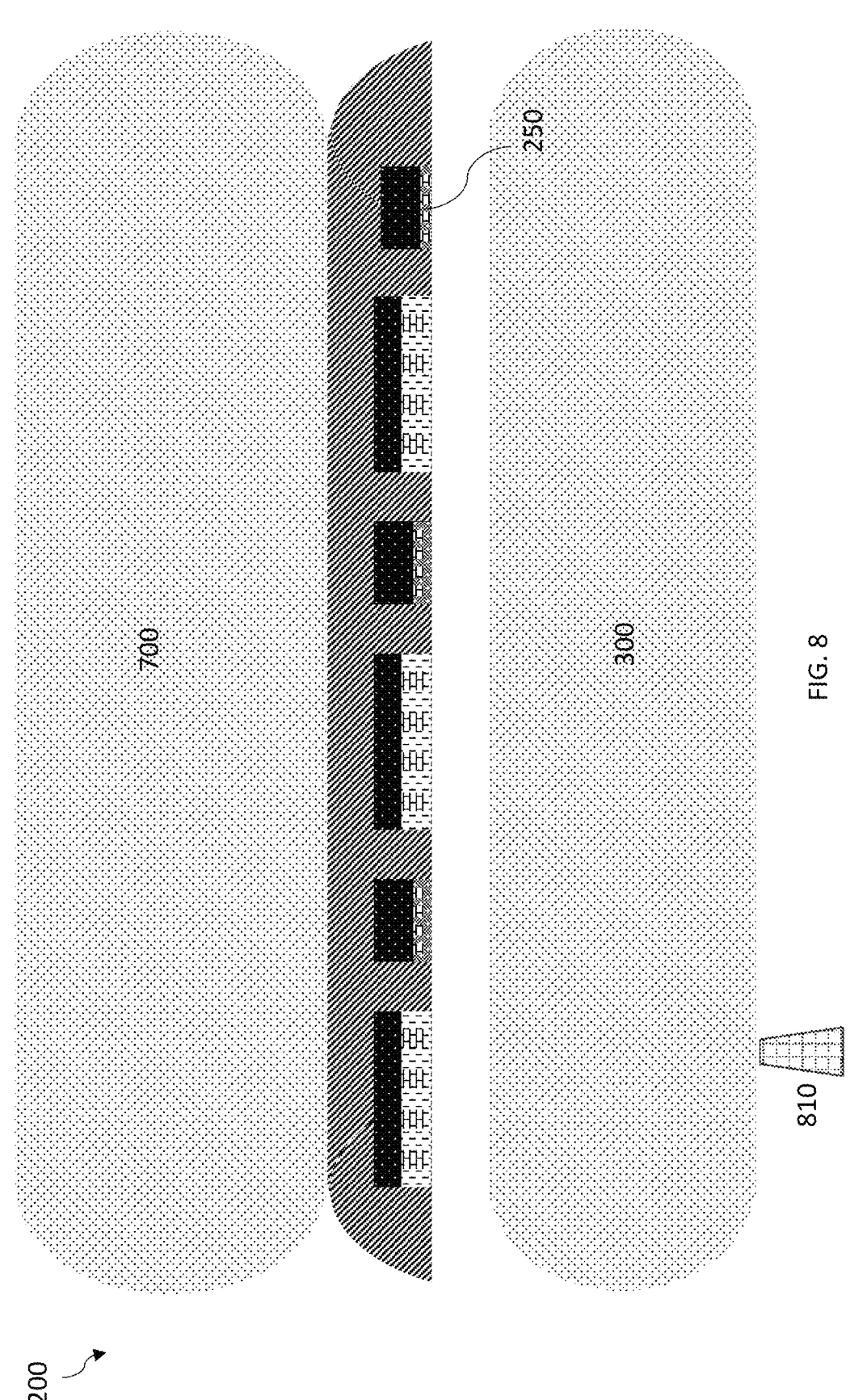

Corresponding to operation 114 of FIG. 1, FIG. 8 is a cross-sectional view of the semiconductor package 200 in which the sacrificial wafer 300 is removed from a remaining portion of the reconstituted wafer, at one of the various stages of fabrication, in accordance with various embodiments.

The sacrificial wafer 300 may be removed through a laser liftoff (LLO) process. In such a LLO process, optical energy (e.g., a laser beam) 810 irradiates the reconstituted wafer through a first surface of the sacrificial wafer 300 with the radiation passing through the sacrificial wafer 300 and to an interface between a second, opposite surface of the sacrificial wafer 300 and the first semiconductor dies 250, e.g., between the second surface of the sacrificial wafer 300 and the LLO layer 262 (FIG. 2) disposed over each of the first semiconductor dies 250. In various embodiments, the sacrificial wafer 300 may be optically transparent to a wavelength of the optical energy 810. As a non-limiting example, the laser radiation incident upon the sacrificial wafer 300 may be 248 nm radiation from a KrF pulsed excimer laser having a pulse width of 38 ns. The energy, passing through the sacrificial wafer 300, is then absorbed by the LLO layer 262 which causes thermochemical dissociation in the LLO layer 262. The first semiconductor dies 250 (while still being bonded to the support wafer 700) can be released, disconnected, or otherwise decoupled from the sacrificial wafer 300. Accordingly, the LLO layer 262 may sometimes be referred to as a release layer. The LLO process can be performed in either vacuum, air, or other ambient environment, and, in general, is performed at an elevated temperature (e.g., higher than 250° C.).

Figure 9:
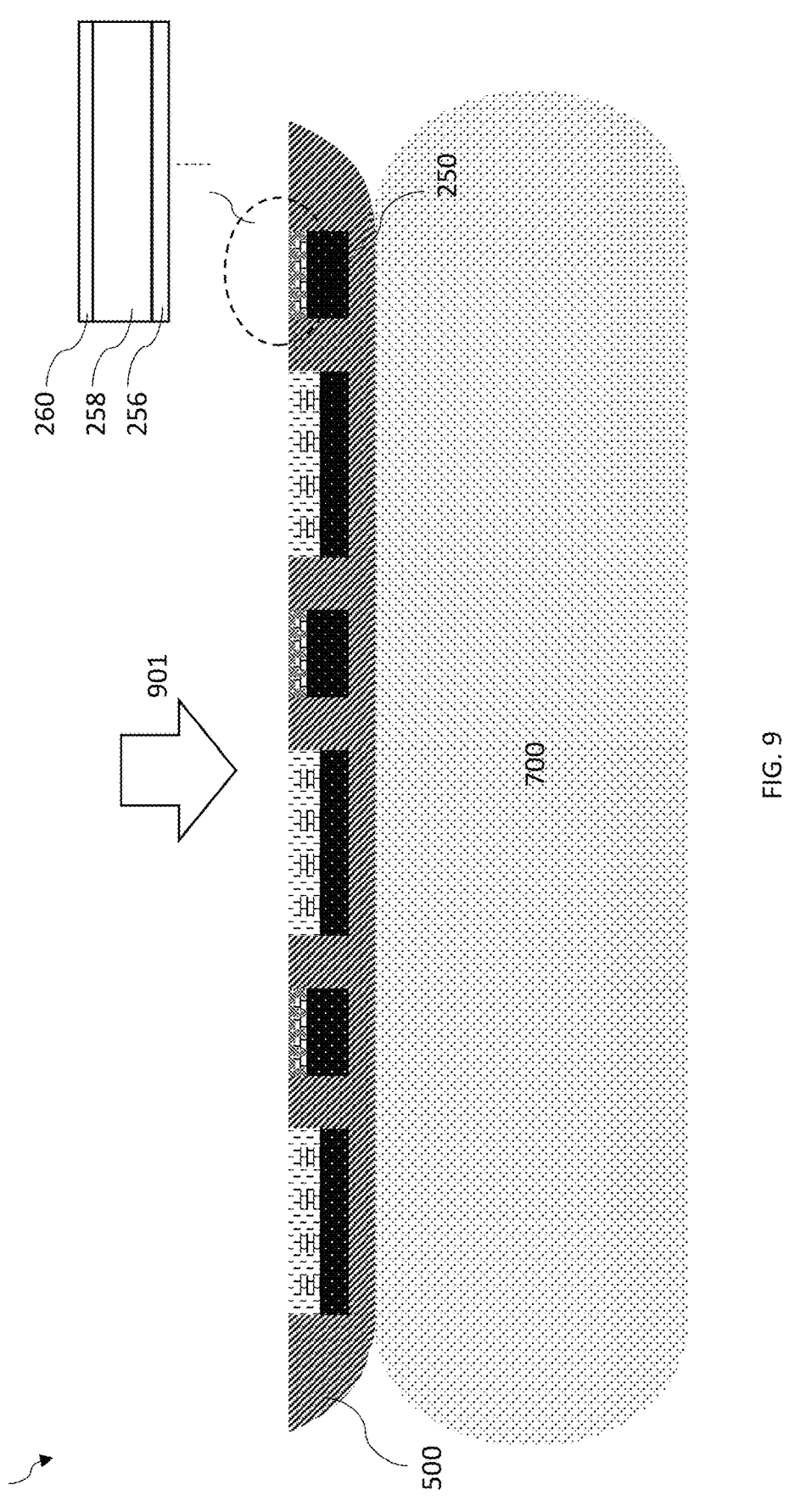

Corresponding to operation 116 of FIG. 1, FIG. 9 is a cross-sectional view of the semiconductor package 200 in which a polishing process 901 may be performed on the first semiconductor dies 250 until their stop layers 260 are exposed, at one of the various stages of fabrication, in accordance with various embodiments.

The polishing process 901 may include a chemical mechanical polishing (CMP) process, which may not be stopped until the stop layers 260 are exposed, in some embodiments. For example, after decoupling from the sacrificial wafer 300 (FIG. 8), respective remaining portions of the LLO layers 262 may still be present over the first semiconductor dies 250. The polishing process 901 can polish out such remaining portions until the stop layers 260 are exposed. Alternatively stated, the stop layers 260 may be configured to stop the polishing process 901. Upon being exposed, the stop layers 260 may be removed to expose the ILD material 258. Next, a number of metal connectors (e.g., bond pads and corresponding vias) can be formed to extend through the ILD material 258 and the barrier layer 256 to be in contact with the interconnect structures disposed in the topmost metallization layer Mx of each first semiconductor die 250, as illustrated in FIG. 10.

Figure 10:
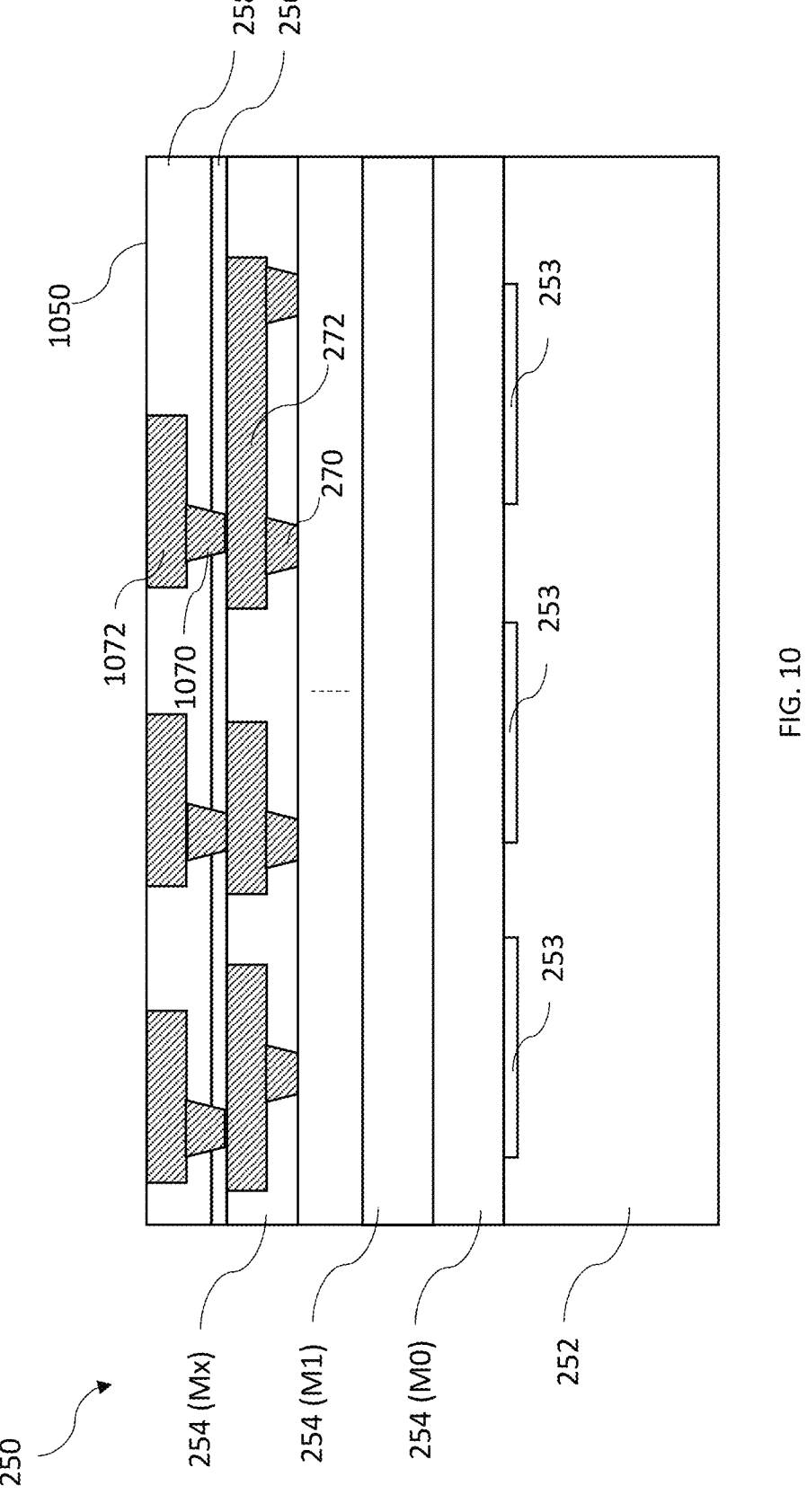

FIG. 10 illustrates a cross-sectional view of one of the first semiconductor dies 250 that are bonded to the support wafer 700, in which a number of vias 1070 and a number of bond pads 1072 are formed over the topmost metallization layer Mx. The vias 1070 and bond pads 1072 may each be formed of one or more conductive materials, such as Cu, Al, W, Ti, TiN, Ta, TaN, or multiple layers or combinations thereof. The vias 1070 and bond pads 1072 may be formed by one or more damascene processes performed on the re-exposed ILD material 258. After forming the bond pads 1072 (as shown in FIG. 10), the first semiconductor dies 250 can have a bonding surface 1050 including both at least one dielectric material (e.g., the ILD material 258) and at least one metal material (e.g., the bond pads 1072). Such a hybrid bonding surface along each of the first semiconductor dies 250 allows the reconstituted wafer (the first semiconductor dies 250 bonded to the support wafer 700) to be bonded to another wafer that may also include a number of (e.g., second) semiconductor dies through a hybrid bonding process that is typically performed at a relatively low temperature (e.g., not greater than 250° C.). As such, the metal connectors may be immune from potential heat damage.

Figure 11:
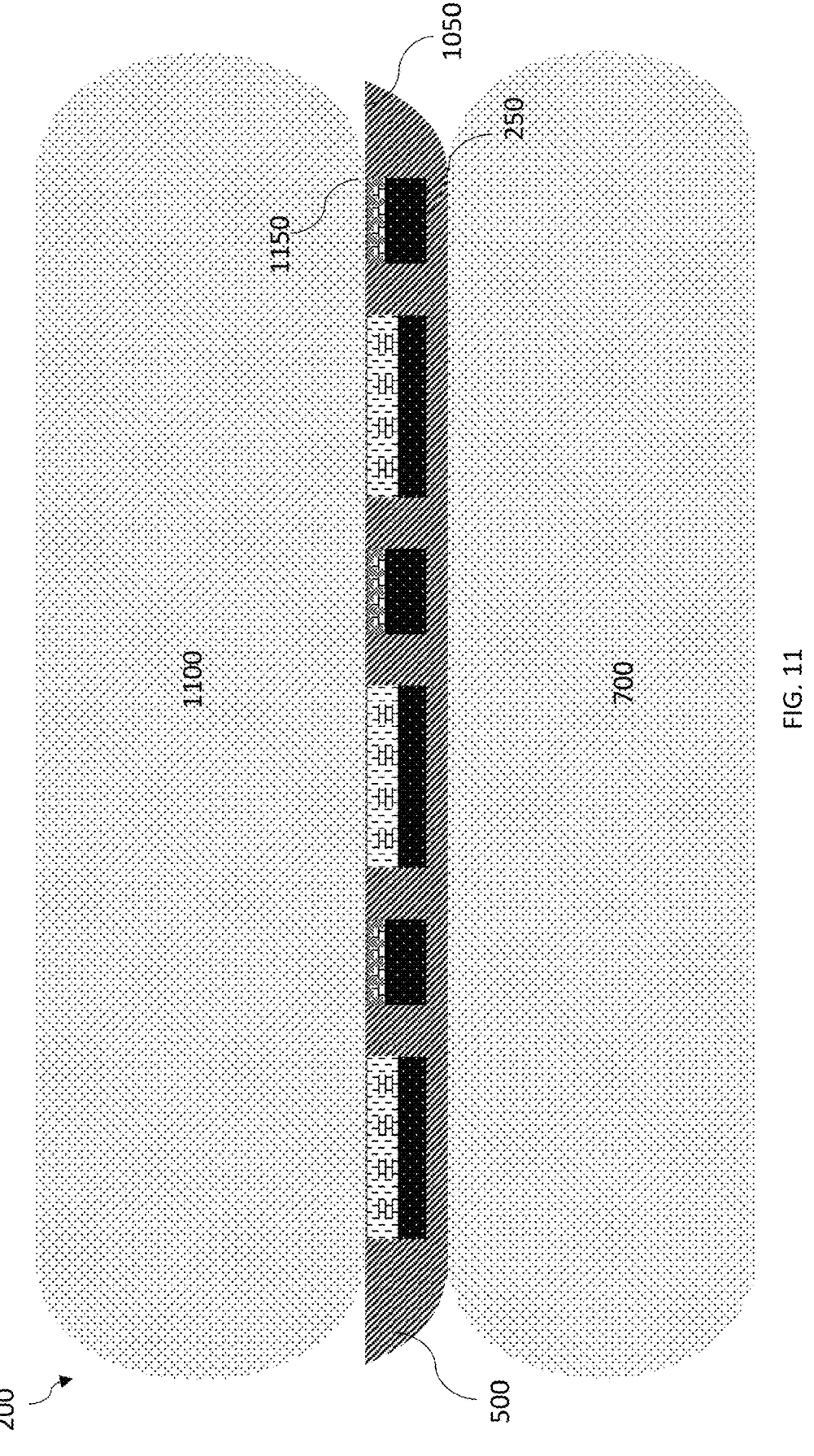

Corresponding to operation 118 of FIG. 1, FIG. 11 is a cross-sectional view of the semiconductor package 200 in which the first semiconductor dies 250 are bonded to a semiconductor wafer 1100 that can also include a number of second semiconductor dies, at one of the various stages of fabrication, in accordance with various embodiments. For clarity, the second semiconductor dies bonded, attached, or otherwise integrated to the semiconductor wafer 1100 are not shown, but it should be appreciated that each of such second semiconductor dies is substantially similar to the first semiconductor die 250. For example, each of the second semiconductor dies can have a hybrid bonding surface (e.g., a combination of dielectric material and metal material), which collectively form a bonding surface 1150. As such, the bonding surface 1050 and bonding surface 1150 can be connected (bonded) to each other through a hybrid bonding process.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/ or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for manufacturing semiconductor packages, comprising:
   providing a first semiconductor die including a plurality of metallization layers;
   overlaying a topmost layer of the metallization layers with a barrier layer;
   overlaying the barrier layer sequentially with a stop layer and a laser liftoff layer;
   attaching a first side of the first semiconductor die to a first wafer through at least the laser liftoff layer;
   attaching a second side of the first semiconductor die to a second wafer at an elevated temperature;
   removing the first wafer from the first semiconductor die through the laser liftoff layer;
   forming, after the step of attaching the second side of the first semiconductor die to the second wafer and the step of removing the first wafer from the first semiconductor die, a plurality of connecters on the first side of the first semiconductor die to electrically couple to the topmost metallization layer; and
   bonding, at a temperature lower than the elevated temperature, the first semiconductor die to a third wafer that includes a second semiconductor die.

2. The method of claim 1, wherein the second semiconductor die includes a plurality of second metallization layers and a plurality of second connecters.

3. The method of claim 2, wherein the step of bonding the first semiconductor die to the third wafer comprises connecting at least one of the plurality of connecters to a corresponding one of the plurality of second connecters.

4. The method of claim 1, prior to forming the plurality of connecters, further comprising forming a plurality of vias extending through the barrier layer to be in contact with the topmost metallization layer, wherein each of the plurality of vias is in contact with a corresponding one of the plurality of connecters.

5. The method of claim 1, wherein the step of removing the first wafer further comprises applying a laser from the first side of the first semiconductor die to cause thermo-chemical dissociation of the laser liftoff layer.

6. The method of claim 5, further comprising polishing out any remaining portion of the laser liftoff layer until the stop layer is exposed.

7. The method of claim 1, wherein the step of attaching a second side of the first semiconductor die to the second wafer further comprises:

forming a first bonding layer over the second side of the first semiconductor die;

planarizing the first bonding layer using a laser;

forming a second bonding layer over the second wafer; and bonding the first bonding layer to the second bonding layer.

8. The method of claim 7, wherein the step of forming the first bonding layer, the step of planarizing the first bonding layer, and the step of bonding the first bonding layer to the second bonding layer are each performed in the elevated temperature.

9. The method of claim 1, wherein the step of attaching the first side of the first semiconductor die to the first wafer and the step of removing the first wafer from the first semiconductor die are each performed in the elevated temperature.

10. The method of claim 1, wherein the step of forming the plurality of connecters on the first side of the first semiconductor die is performed at a temperature not greater than about 250° C.

11. A method for manufacturing semiconductor packages, comprising:

bonding a plurality of semiconductor dies to a first wafer on their respective first sides;

bonding the plurality of semiconductor dies to a second wafer on their respective second sides at an elevated temperature;

decoupling the first wafer from the plurality of semiconductor dies;

forming, after the step of bonding the plurality of semiconductor dies to the second wafer and the step of decoupling the first wafer from the plurality of semiconductor dies, a plurality of first connecters in electrical contact with the plurality of semiconductor dies that are placed on the second wafer; and bonding, at a temperature lower than the elevated temperature, the plurality of semiconductor dies to a third wafer by connecting the plurality of first connecters to a plurality of second connecters disposed on the third wafer, respectively.

12. The method of claim 11, wherein the step of forming the plurality of first connecters is performed after any of the step of bonding the plurality of semiconductor dies to the first wafer, the step of bonding the plurality of semiconductor dies to the second wafer, or the step of decoupling the first wafer from the plurality of semiconductor dies.

13. The method of claim 12, wherein each of the step of bonding the plurality of semiconductor dies to the first wafer, the step of bonding the plurality of semiconductor dies to the second wafer, and the step of decoupling the first wafer from the plurality of semiconductor dies is performed in the elevated temperature.

14. The method of claim 11, wherein the step of decoupling the first wafer from the plurality of semiconductor dies further comprises applying a laser through the first wafer on the first sides of the semiconductor dies.

15. The method of claim 11, wherein, prior to forming the plurality of first connecters, each of the semiconductor dies comprises:

a plurality of metallization layers;

a barrier layer completely overlaying a topmost one of the plurality of metallization layers;

a dielectric layer overlaying the barrier layer;

a stop layer overlaying the dielectric layer; and a laser liftoff layer overlaying the stop layer.

16. The method of claim 15, subsequently to decoupling the first wafer from the plurality of semiconductor dies, further comprising:

polishing from the first sides of the semiconductor dies until the stop layer of at least one of the semiconductor dies is exposed; and forming a plurality of vias extending through the barrier layer and the dielectric layer;

wherein the plurality of first connecters are electrically coupled to the topmost metallization layer through the plurality of vias, respectively.

17. The method of claim 11, wherein the step of bonding the plurality of semiconductor dies to the third wafer is performed through a hybrid bonding technique.

18. A method for manufacturing semiconductor packages, comprising:

preparing a plurality of semiconductor dies, each of the plurality of semiconductor dies, on its first side, including a plurality of metallization layers, a dielectric layer completely overlaying a topmost one of the metallization layers, a stop layer overlaying the dielectric layer, and a laser liftoff layer overlaying the stop layer;

bonding the plurality of semiconductor dies to a first wafer with the respective first sides;

bonding the plurality of semiconductor dies to a second wafer with their respective second sides at an elevated temperature;

decoupling, based on causing thermochemical dissociation of the laser liftoff layer of each of the plurality of semiconductor dies, the first wafer from the plurality of semiconductor dies;

forming, after the step of bonding the plurality of semiconductor dies to the second wafer and the step of decoupling the first wafer from the plurality of semiconductor dies, a plurality of vias extending through the dielectric layers to be in contact with the topmost metallization layers, respectively;

forming a plurality of first connecters in contact with the plurality of vias, respectively; and bonding, at a temperature lower than the elevated temperature, the plurality of semiconductor dies to a third wafer by connecting the plurality of first connecters to a plurality of second connecters disposed on the third wafer, respectively.

19. The method of claim 18, wherein each of the step of bonding the plurality of semiconductor dies to the first wafer, the step of bonding the plurality of semiconductor dies to the second wafer, and the step of decoupling the first wafer from the plurality of semiconductor dies is performed in the elevated temperature.

20. The method of claim 18, wherein each of the step of forming the plurality of vias and the step of forming the plurality of first connecters is performed at a temperature not greater than about 250° C.

\* \* \* \* \*